(12) United States Patent
Derflinger et al.

(10) Patent No.: US 6,827,976 B2
(45) Date of Patent: Dec. 7, 2004

(54) METHOD TO INCREASE WEAR RESISTANCE OF A TOOL OR OTHER MACHINE COMPONENT

(75) Inventors: Volker Derflinger, Feldkirch (AT); Hans Braendle, Sargans (DE); Christian Wohlrab, Feldkirch (AT)

(73) Assignee: Unaxis Trading AG, Truebbach (CH)

( * ) Notice: Subject to any disclaimer, the term of this patent is extended or adjusted under 35 U.S.C. 154(b) by 0 days.

(21) Appl. No.: 10/123,304

(22) Filed: Apr. 17, 2002

(65) Prior Publication Data

US 2003/0035894 A1 Feb. 20, 2003

Related U.S. Application Data

(63) Continuation of application No. 09/538,275, filed on Mar. 30, 2000, now abandoned, which is a continuation-in-part of application No. 09/113,548, filed on Jul. 10, 1998, now abandoned.

(30) Foreign Application Priority Data

Apr. 29, 1998 (CH) ................................................ 966/98

(51) Int. Cl.$^7$ ............................................. C23C 14/06
(52) U.S. Cl. ............... 427/249.1; 427/250; 427/255.31; 427/255.394; 427/577; 204/192.1; 204/192.38
(58) Field of Search .............................. 427/249.1, 250, 427/255.31, 255.394, 577; 204/192.1, 192.38

(56) References Cited

U.S. PATENT DOCUMENTS

| | | | | |
|---|---|---|---|---|
| 4,675,206 A | * | 6/1987 | Ikegaya et al. | 427/570 |
| 5,055,318 A | * | 10/1991 | Deutchman et al. | 204/288.04 |
| 5,490,911 A | * | 2/1996 | Makowiecki et al. | 204/192.15 |
| 5,707,748 A | * | 1/1998 | Bergmann | 428/489 |
| 5,725,913 A | * | 3/1998 | Wong et al. | 204/192.15 |
| 6,033,533 A | * | 3/2000 | Sugiyama et al. | 204/192.12 |
| 6,054,185 A | * | 4/2000 | Inspektor | 204/192.11 |
| 6,071,560 A | * | 6/2000 | Braendle et al. | 427/249.19 |
| 6,117,280 A | * | 9/2000 | Yaginuma et al. | 204/192.12 |
| 6,162,715 A | * | 12/2000 | Mak et al. | 438/592 |
| 6,558,749 B2 | * | 5/2003 | Braendle | 427/419.7 |
| 6,562,445 B2 | * | 5/2003 | Iwamura | 428/217 |

* cited by examiner

Primary Examiner—Bret Chen
(74) Attorney, Agent, or Firm—Crowell & Moring LLP

(57) ABSTRACT

A method for manufacturing a tool or machine component increases wear resistance by providing a base body made of a metal or of a hard metal and having a surface. At least a portion of the surface is vacuum coated with a hard solid layer system having at least one layer of a material selected from the group consisting of nitrides, carbides, oxides, carbonitrides, oxynitrides, and oxycarbonitrides of at least one metal. A metallic intermediate layer having the at least one metal is vacuum deposited on the hard solid layer system, and a sliding layer system is vacuum deposited on the metallic intermediate layer.

40 Claims, 10 Drawing Sheets

METHOD TO INCREASE WEAR RESISTANCE OF A TOOL OR OTHER MACHINE COMPONENT

Figure 1:
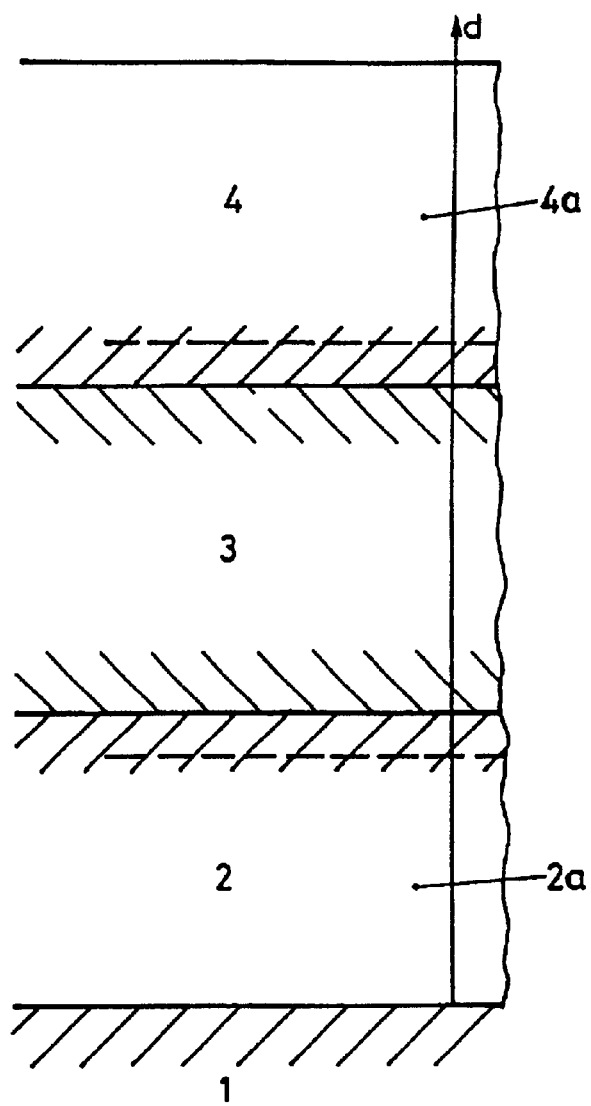

This application is a continuation of application Ser. No. 09/538,275, filed Mar. 30, 2000, now abandoned which is a continuation-in-part of application Ser. No. 09/113,548, filed Jul. 10, 1998 now abandoned.

The present invention starts from the need to coat tools, and thereby particularly cutting tools or form tools with a base body of metal, thereby in particular of HSS or of tool steel or of hard metal, in such a manner, that they are particularly suitable for dry processing operation or for operation under minimum lubrication (shortage lubrication) etc.

From the solution of this problem and according to the present invention there results a protection coating technique, which is suitable also for other tools and mechanical components, when they are used with little or no lubrication and/or under a high surface loading.

Under ecological and under economical considerations, the operation of tools, in particular of cutting tools and of form tools under minimum lubrication conditions is highly interesting. Under economical aspects it has to be noted that the costs for cooling lubricant, in particular for cutting tools, are substantially higher than for the tool itself. By applying cooling lubricant in the contacting area of tool and workpiece, chips are washed out and heat is dissipated, furthermore a cleaning and corrosion-preventing effect is reached.

There exists an increasing and substantial need to stop using conventional amounts of cooling lubricant, e.g. of 300 to 4000 liters per hour, for a chipping tool processing, and to drastically reduce that amount to, e.g., only 6 to 70 ml per hour for the same number of operations.

This leads to a highly sophisticated task, on the one hand, with respect to forming of the tools, on the other hand, with respect to surface treatment applied to such tools and mechanical components. The present invention addresses the last mentioned task.

In the context of the aforementioned problem the task mentioned above is resolved by proposing a tool or mechanical component at which, according to the invention, the hard material coating system comprises at least one hard material layer made of a material selected from the group of Nitrides, Carbides, Oxides, Carbonitrides, Oxynitrides or also herein Oxinitrides, Oxycarbonitrides or also herein Oxicarbonitrides of at least one metal, and further an intermediate layer is provided immediately between the mentioned at least one hard material layer and—propagating in direction from the inside of the base body towards its outside—before the slide layer system, which intermediate layer is made of the same at least one metal, which is present in the at least one hard material layer of the hard material layer system.

It is known from the U.S. Pat. No. 5,707,748 of the same applicant as the present application to deposit a hard material layer system onto the base body of a tool, directly followed by a slide protection layer system. As materials for the hard material layer system metal Carbides, metal Nitrides, metal Carbonitrides or combinations thereof have been proposed, as materials for the slide protection layer system materials based on Carbon, such as especially Tungsten carbide or also herein Tungstencarbide with dispersed Carbon, WC/C. The known coating has been used with the principal target of increasing the etch life of cutting tools.

The present invention starts from the finding that this known coating technique can be used to fulfil the extreme requirements underlying the problem to be solved in respect to the tools or mechanical components, in particular to cutting tools, if the known overall layer system is construed as proposed by the present invention, in particular by means of inventively providing the metallic intermediate layer.

Figure 2:
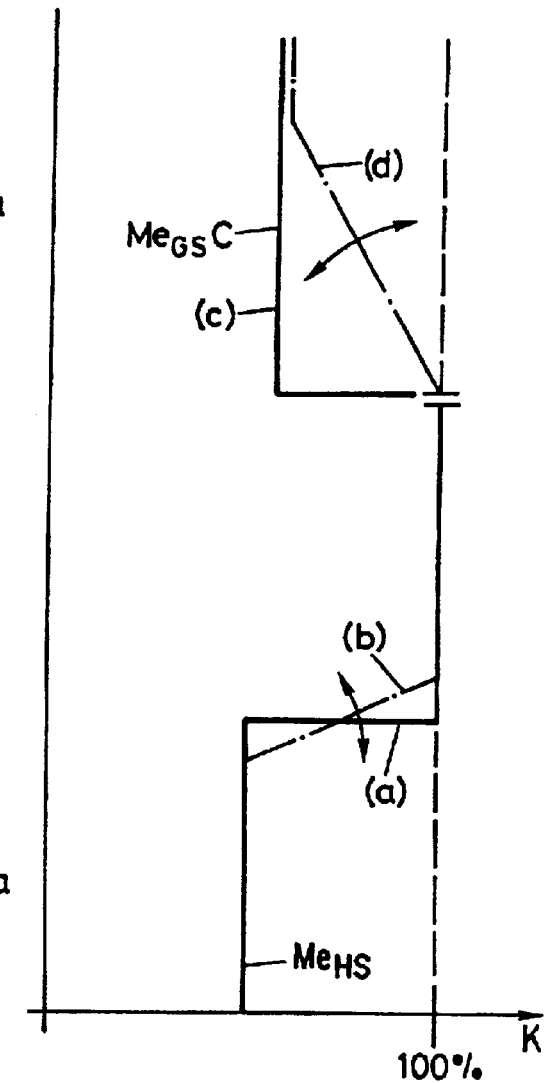
Figure 3:
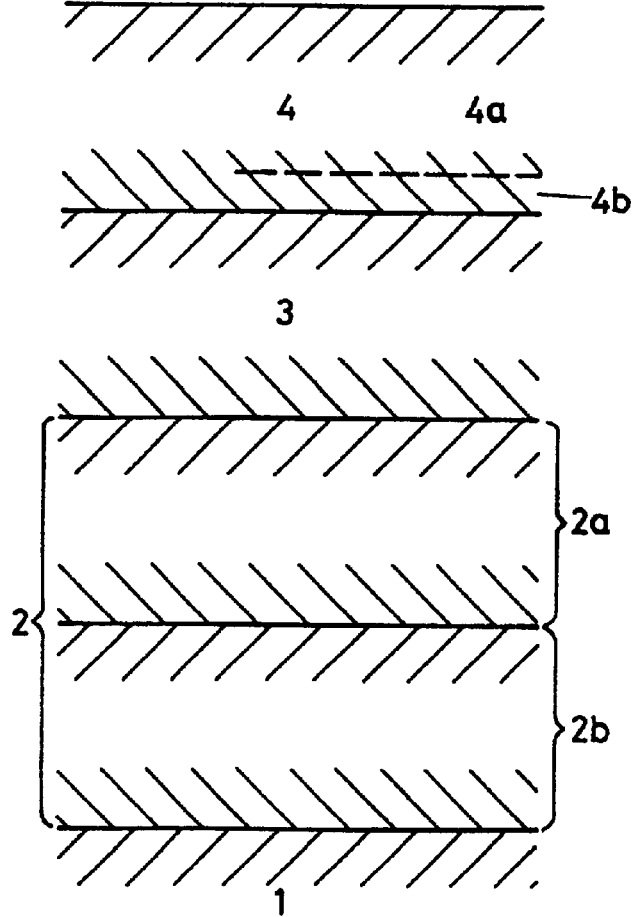
Figure 4:
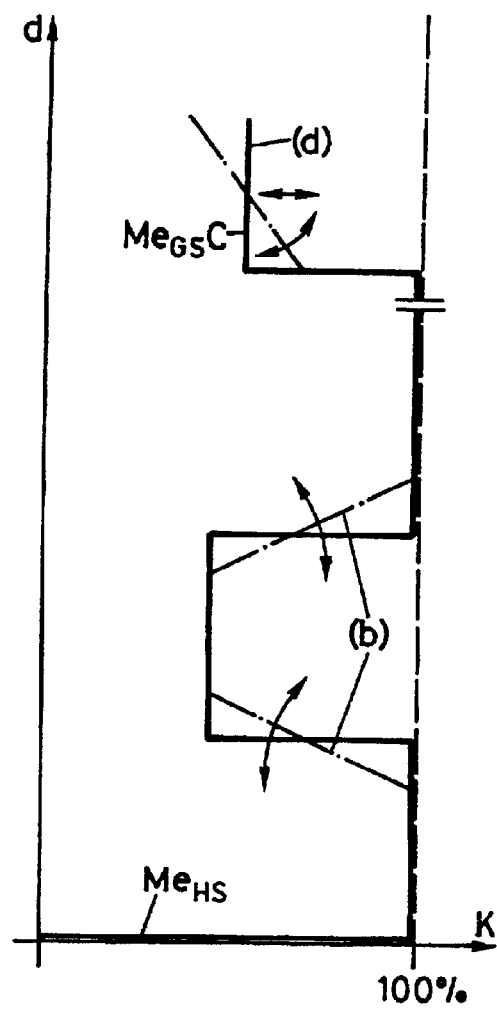
Figure 5:
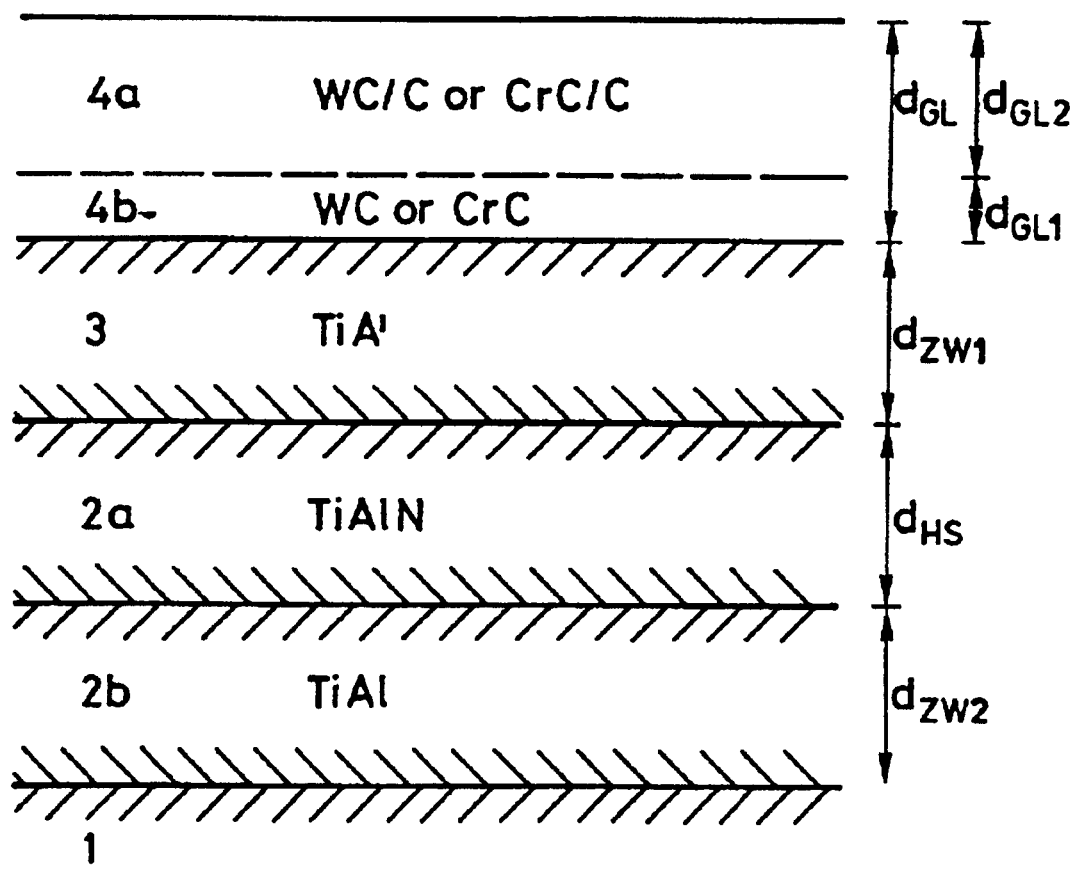
Figure 6:
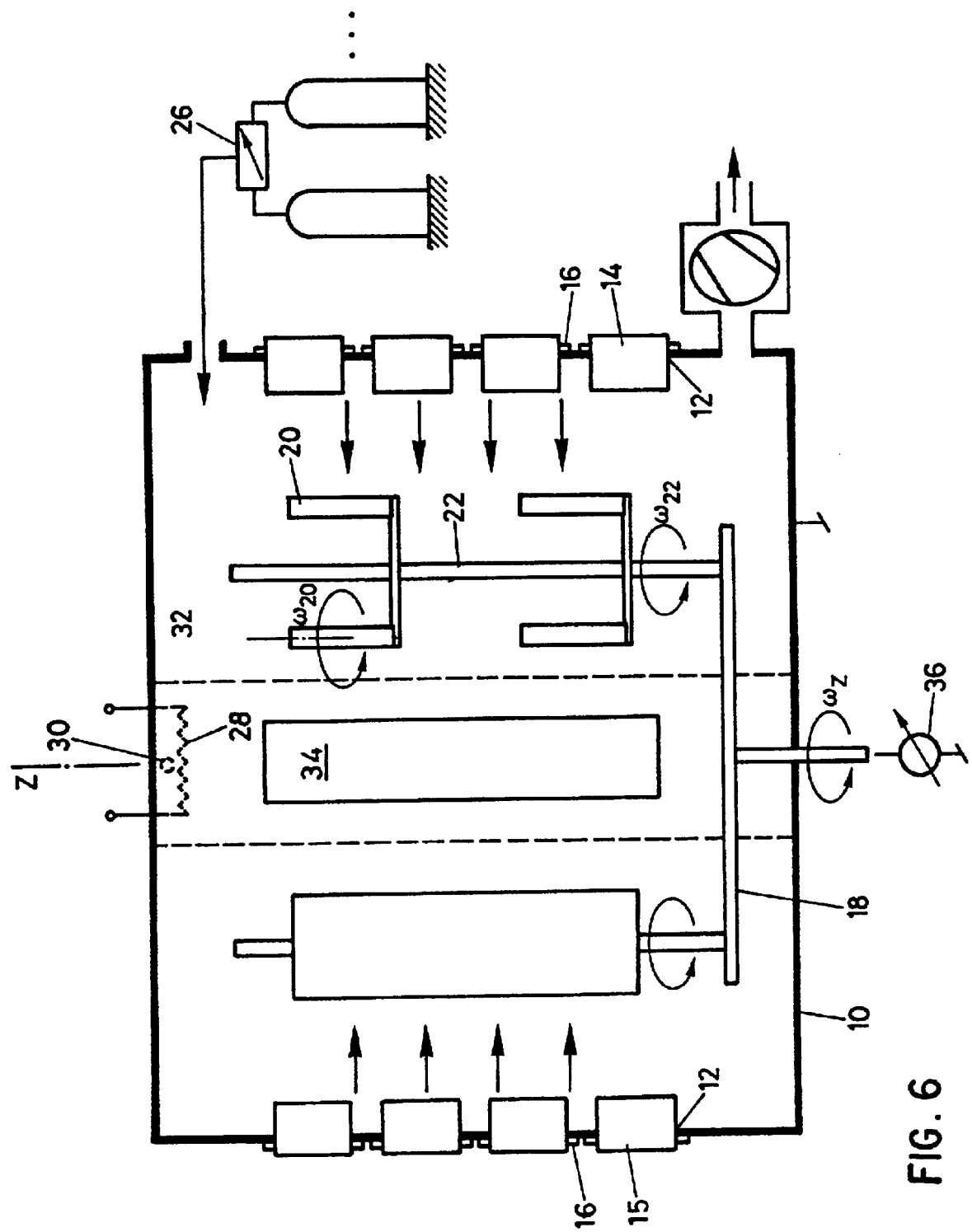
Figure 7:
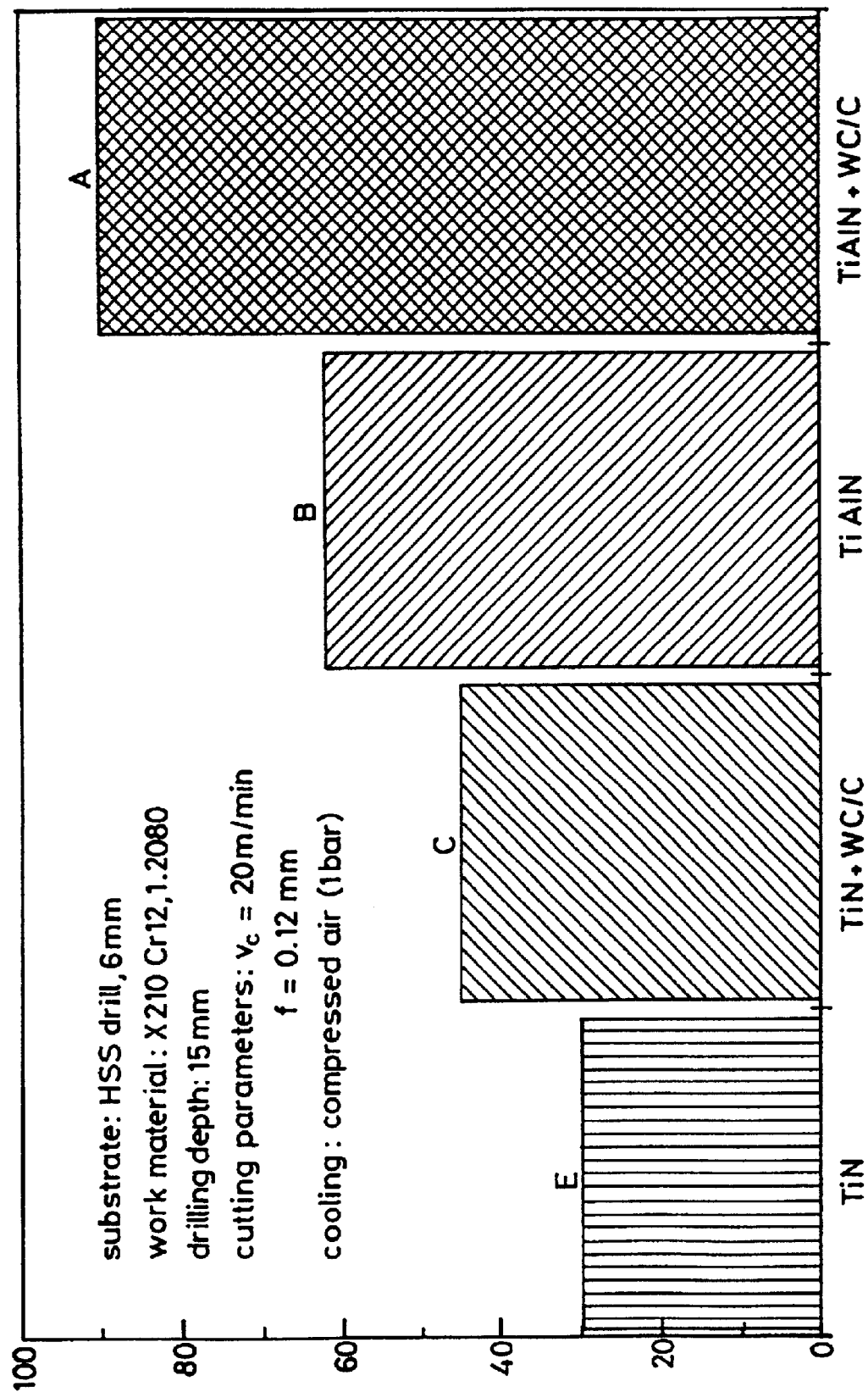
Figure 8:
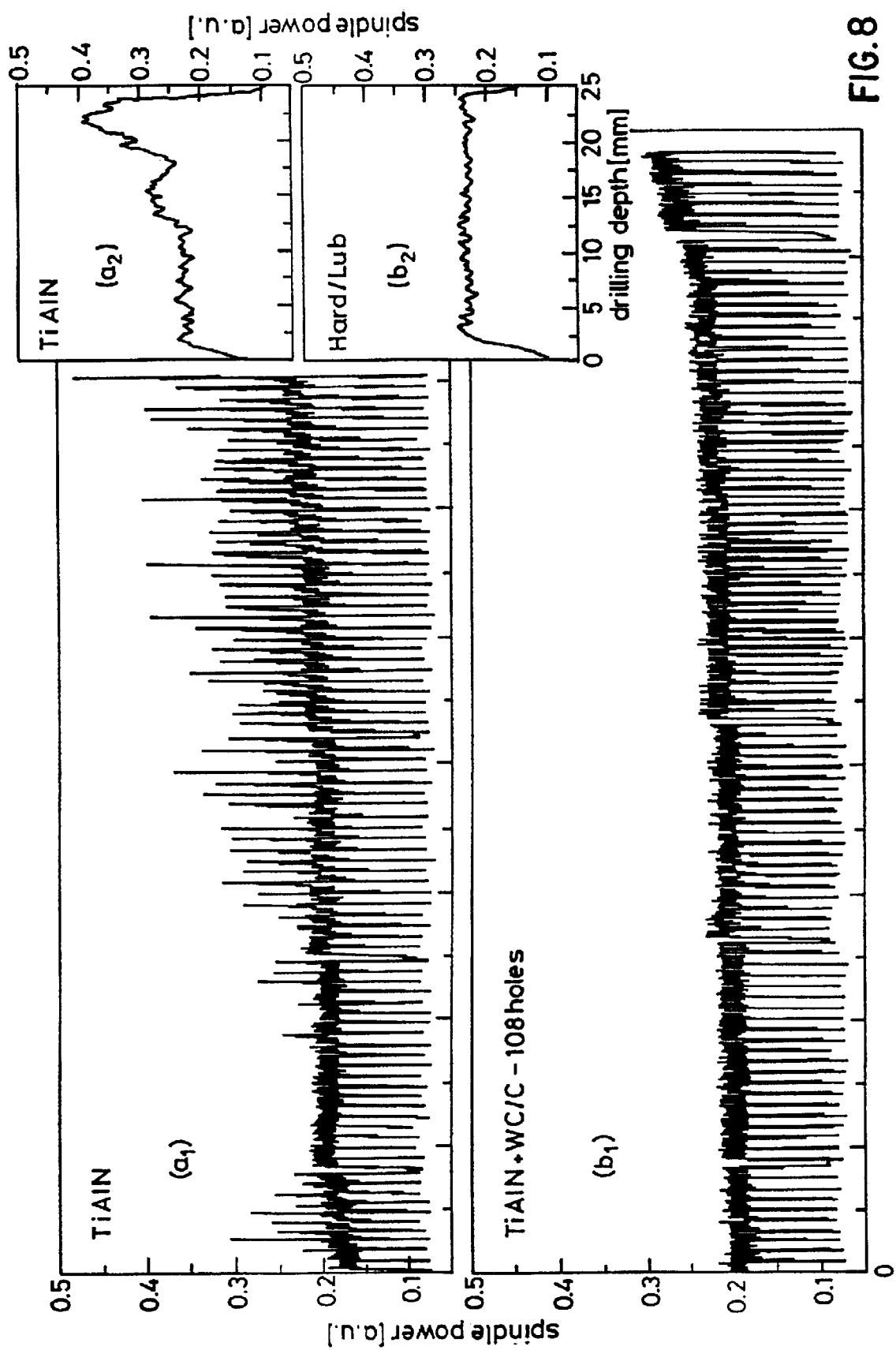

The tool or mechanical component according to the present invention and according to one of the claims 1, 32, 33, 34, the manufacturing method according to the present invention according to claim 21, and the system according to the present invention according to claim 31 and their preferred embodiments according to the claims 2 to 20, and 22 to 30 respectively will be further explained by way of examples referring to drawings, as well as to Experiments. The figures show:

FIG. 1 exclusively qualitatively, a layer system according to the invention on a tool or machine component base body in minimum configuration, FIG. 2 preferred courses of concentration realised according to the invention and considered along the thickness extension, in schematic, qualitative representation, FIG. 3 departing from a representation according to FIG. 1, a further preferred embodiment of the overall layer system according to the invention with FIG. 4 preferred courses of concentration, represented in analogy to FIG. 2, FIG. 5 departing from the representations according to FIGS. 3 and 4, an embodiment of the overall layer system according to the invention as particularly preferred today, FIG. 6 schematically and in a longitudinal cross-sectional view, a plant system according to the invention, in simplified representation, FIG. 7 a comparison of drill etch life results between drills coated according to the invention and drills coated according to the state of the art, FIG. 8 a comparison of the course of spindle torque of drills with known coating (a) and with coating according to the invention (b), FIGS. 9 to 12: the results of further experiments with inventively coated tools compared with non-inventive standard tools.

Basic Configuration

In FIG. 1, the basic or minimum configuration of an overall layer system according to the invention is represented, which system is provided on a tool or machine component according to the invention. Thereby, it has to be pointed out that the representation of thickness shall not be understood quantitatively, which is also valid for thickness ratios. The same also applies for FIGS. 3 and 5.

On a base body 1 made of a metal, thereby preferably of HSS or of a tool steel or a hardened steel or a hard metal, a hard material layer system 2 is deposited which comprises at least one hard material layer 2*a* or which consists of at least one hard material layer 2*a* which latter is formed of a material selected from the group Nitrides, Carbides, Oxides, Carbonitrides, Oxinitrides, Oxicarbonitrides of at least one metal.

On the hard material layer system 2 a metallic intermediate layer 3 is deposited, which consists of the same at least one metal which is present in the aforementioned hard material layer 2*a* of the hard material layer system 2. Thereby, for a hard material layer system 2 with several layers, the mentioned hard material layer 2*a* directly lies at the intermediate layer 3 as is shown by dashed lines in FIG. 1.

A slide layer system 4 lies above the intermediate layer 3. This slide layer system 4 again comprises at least one slide layer 4*a* or consists of a slide layer 4*a*, whereby in the case of a multi-layer slide layer system, as represented in FIG. 1, the slide layer 4a to be discussed below terminates the layer system towards its outside. This slide layer 4a is preferably formed by a Carbide of at least one metal and of dispersed Carbon, MeC/C, and/or by Molybdenedisulfide and/or by Molybdenediselenide.

The metal used for the hard material layer system 2 and in particular for the mentioned at least one layer 2a is preferably Titanium, Chromium, Hafnium, Zirconium or Aluminum, preferably two of these metals, particularly preferred Ti and Al and/or Cr and Al. Thereby, said layer 2a preferably consists of TiAlN, CrAlN or CrN, especially preferred of TiAlN or CrAlN.

The slide layer system, and thereby in particular its at least one layer 4a, is preferably formed from a Carbide of at least one metal of the group IVb, Vb and/or VIb and/or of Silicon and/or of Boron, thereby preferably of Tungstencarbide, Chromiumcarbide or Titaniumcarbide besides the dispersed Carbon which is incorporated in the slide layer 4a.

Preferred Layer Structure

In FIG. 3, departing from a representation according to FIG. 1, a preferred layer structure is shown, departing from its minimal configuration according to FIG. 1. Thereby, the same reference signs are used for parts already described. On the base body 1 and in the hard material layer system 2, a further metallic intermediate layer 2b is provided. Preferably, it also consists, as the one intermediate layer 3 according to FIG. 1, of the same metal as is comprised in the at least one hard material layer 2a of the hard material layer system 2.

Preferably, between the mentioned at least one layer 4a of the slide layer system 4 and the intermediate layer 3 there is provided a layer 4b at the slide layer system 4, which layer 4b substantially exclusively consists of the metal Carbide. Dispersed Carbon to a significant amount is only provided in the layer 4a, and if not Molybdenedisulfide or Molybdenediselenide is used. The slide layer system 4 has preferably a somewhat smaller thickness than the hard material layer system 2.

Layer Transitions

Considered at the minimal configuration according to FIG. 1, and as schematically shown in FIG. 2(a), the concentration K of the one or of the more than one metals $Me_{HS}$ provided in the hard material layer 2, particularly in the at least one hard material layer 2a, can be constant throughout the hard material system and particularly throughout the at least one layer 2a and increases suddenly to at least approx. 100% at the metal layer 3. By controlling the coating process, and as represented in (b), a reduced transition slope of the concentration $Me_{HS}$, preferably substantially steadily, can be realised from the hard material system 2 towards the metal intermediate layer 3.

In the slide layer system 4, the metal Carbide concentration $Me_{GS}C$, and as represented at (c), can be kept constant in the at least one slide layer 4a, or the concentration, the content of metal Carbide, can be—preferably—decreased stepwise or continuously, towards the outside, as is represented schematically at (d).

At the preferred embodiment according to FIG. 3, and as shown in analogy to FIG. 2 in FIG. 4, the content of the metal $Me_{HS}$ in the further metal intermediate layer 2b can substantially abruptly decrease at the transition towards the further hard material layer system 2a and then increases again abruptly on to at least approx. 100% at the transition towards the metal intermediate layer 3. On the other hand, as represented at (b) of FIG. 4, a stepwise, preferably continuous concentration change of $Me_{HS}$ can be realised at the one and/or the other of the mentioned transitions.

In the slide layer system 4, preferably a practically 100% $Me_{GS}C$-concentration is provided in the layer 4b, which concentration decreases abruptly or in steps, thereby preferably continuously towards the outside, due to, the additional dispersed Carbon, as represented at (d) of FIG. 4.

Preferred Layer Structure of Today

In FIG. 5 the overall layer structure as preferably used today is shown in an analogous representation to the FIGS. 1 and 3.

If an intermediate layer 2b is provided according to FIG. 3 it consists of TiAl or CrAl. The further hard material layer system 2a or, without intermediate layer 2b, the hard material layer system 2 per se substantially consists of TiAlN or CrAlN respectively. The intermediate layer 3 consists respectively of TiAl or CrAl.

If layer 4b is provided according to FIG. 3 it substantially consists of Tungstencarbide or Chromiumcarbide, the slide layer system 4a of Tungstencarbide or Chromiumcarbide or Titaniumcarbide and dispersed Carbon C.

In the following table I, five basic embodiments with hard material layer 2a or 2 respectively, intermediate layer 3 and slide layer 4a or 4 respectively are shown. The numbers Nr. 1 to Nr. 5 thereby accord with a current priority of preference.

TABLE I

| | + Preference → − | | | | |
|---|---|---|---|---|---|
| | Nr. 1 | Nr. 2 | Nr. 3 | Nr. 4 | Nr. 5 |
| hard substance layer 2a or 2 | CrAlN | TiAlN | CrAlN | CrN | TiB TiBN MeBX MeB |
| intermediate layer 3 | CrAl | TiAl | CrAl | Cr | TiMe |
| slide layer 4a or 4 | WC/C or TiC/C or CrC/C | TiC/C or CrC/C | CrC/C or TiC/C | CrC/C or TiC/C or WC/C (pref.) | CrC/C or TiC/C or WC/C (pref.) |

Thereby, in some cases the slide layer 4 or 4a may consist or comprise Molybdenedisulfide or Molybdenediselenide.

Further, it must be pointed out that the present invention may also be used in context with hardened steel substrates, which may have advantages in tool applications with very high mechanical strength per surface area.

The slide system 4 may additionally comprise a terminating Carbon layer, especially preferred of a-c:H or DLC without substantial additive of a metallic component. With respect to the definition of a-c:H we refer to René A. Häfler, "Oberflächen-und Dünnschicht-Technologie" (Surface and thin film technology), Springer; Berlin, Heidelberg, New York, London, Paris, Tokyo, 1987, Part I "Beschichtung von Oberflächen" (Coating of surfaces), pp. 169 to 172.

With respect to DLC (diamond-like carbon) we refer to ASM handbook, third printing 1999, pp. 553, 554.

Deposition of this layer may thereby be performed by means of plasma-activated Carbon containing gas, by sputtering or evaporation of at least one Carbon target applied in the respective coating chamber. Adhesion of such layer may thereby be increased by applying a DC or AC or, superimposed, AC and DC, thereby especially of a pulsed bias to the substrate relative to the target.

It goes without saying that for all deposition steps used within the present invention, plasma activation may be done by glow discharge, by high current low-voltage arc discharge, by means of hollow cathode etc.

Preferred Thickness Dimensions

Hard Substance Layer Systems:

The hard substance layer system 2, especially if, in its preferred embodiment according to FIG. 5, made of TiAlN or CrAlN, has a thickness $d_{HS}$ as follows:

$$0.1 \ \mu m \leq d_{HS} \ 6 \leq \mu m,$$

thereby preferably $$2 \ \mu m \leq d_{HS} \leq 5 \ \mu m.$$

Metal Intermediate Layer 3:

The metal intermediate layer 3, in particular if consisting of TiAl or CrAl according to FIG. 5, has a thickness $d_{ZW1}$:

$$0.01 \ \mu m \leq d_{ZW1} \leq 1 \ \mu m,$$

preferably $$0.1 \ \mu m \leq d_{ZW1} \leq 0.5 \ \mu m.$$

Slide Layer System 4:

The slide layer system 4 has, in particular in the preferred embodiment according to FIG. 5, a thickness $d_{GL}$ as follows:

$$0.1 \ \mu m \leq d_{GL} \leq 6 \ \mu m,$$

thereby preferably $$1 \ \mu m \leq d_{GL} \leq 3.5 \ \mu m.$$

If according to FIG. 3 or 5 the slide layer system is split into the substantially pure Carbide layer 4b and the remaining layer system 4a with dispersed Carbon, the respective thicknesses $d_{GL1}$ and $d_{GL2}$ are preferably and respectively chosen as follows:

$$0.01 \ \mu m \leq d_{GL1} \leq 1 \ \mu m,$$

preferably $$0.1 \ \mu m \leq d_{GL1} \leq 0.5 \ \mu m$$

$$0.1 \ \mu m \leq d_{GL2} \leq 5 \ \mu m,$$

preferably $$1 \ \mu m \leq d_{GL2} \leq 3 \ \mu m.$$

Intermediate Layer 2b:

If provided, the further metal intermediate layer 2b is construed with a thickness $d_{ZW2}$ as follows:

$$0.01 \ \mu m \leq d_{ZW2} \leq 1 \ \mu m,$$

thereby preferably $$0.1 \ \mu m \leq d_{ZW2} \leq 0.5 \ \mu m.$$

Coating Method

Hard Material System

The hard material layer system with, as was mentioned, the at least one hard material layer, preferably of CrAlN or TiAlN, can be produced by reactive sputtering, thereby preferably by reactive magnetron sputtering or by reactive cathodic arc evaporation. Preferably, it is produced by reactive cathodic arc evaporation. Thereby, highly dense ion plated structures are realised without pores and with steady transitions to the subsequent layer systems and to the base body material respectively.

Intermediate Layer 3

The intermediate layer 3, made of the same at least one metal as contained in the hard material system 2 with the at least one layer 2a, according to FIG. 5 preferably made of CrAl or TiAl, is preferably deposited so that the same coating process, as used for the hard material layer system 2, is used now in a non-reactive mode. A stepwise, preferably continuous transition between the hard material layer system and the intermediate layer 3, as schematically represented in FIG. 2 at (b), is realised by specifically controlled reduction of the reactive gas flow, for the embodiment according to FIG. 5 of the flow of gas containing Nitrogen, up to reaching non-reactive metal sputtering mode, however preferably non-reactive metallic arc evaporation mode.

Slide Layer System 4

The slide layer system is realised by cathodic arc evaporation or, preferably, by sputtering of a target, in particular by magnetron sputtering of a target, directly or, for the embodiment according to FIG. 5, time staggered, in an atmosphere containing Carbon, as in an atmosphere with $C_2H_2$, $C_2H_4$ etc. Preferably Carbide targets are used.

Compared to the also possible reactive sputtering of metallic targets, sputtering of Carbide targets has the advantage that overall a higher C-content in the layer being deposited is reached. A matrix of amorphous Carbon with nano-crystalline Carbide corns is created. By cyclically exposing the workpieces more and less to the at least one Carbide source, in particular to the at least one Carbide sputtering source, a laminar microstructure of layers with changing ratio of dispersed Carbon and Carbide is created, highly advantageous for a slide layer system. Gradual transitions, as schematically represented in the FIGS. 2 and 4 at (d) respectively, are realised by specifically controlling the Carbon amount in the sputtering atmosphere with respect to the amount of sputtered-off material.

Pre-Processing of the Base Body Surface

It is advised to plasma etch the base body surface before coating, in particular using a low-voltage discharge. In the following table the variables of the decisive process parameters as applied are listed for a coating according to the invention as of FIG. 5 and with an apparatus according to FIG. 6, and still further for TiAlN hard material layer.

TABLE II

| | TiAl | TiAlN | TiAl | WC | WC/C |
|---|---|---|---|---|---|
| $P_{TiAl}$ [kW] | 6 | 6 | 6 | — | — |
| $P_{WC}$ [kW] | — | — | — | 4 | 4 |
| $P_{N2}$ [mbar] | — | $0.5–5 \times 10^{-2}$ | — | — | — |
| $P_{Ar}$ [mbar] | $0.5–5 \times 10^{-2}$ | — | $0.5–5 \times 10^{-2}$ | $0.5–5 \times 10^{-2}$ | $0.5–5 \times 10^{-2}$ |
| $P_{C2H2}$ [mbar] | — | — | — | — | $0–3 \times 10^{-2}$ |
| $U_{subtr.}$ [-V] | 20–200 | 20–200 | 20–200 | 1–200 | 0–10[(*)] |

Temperature range: T = 200–500° C.

[(*)]may also be positive

System i.e. Apparatus Configuration

In FIG. 6 a system according to the invention for applying the method according to the invention is schematically shown in a simplified manner. The system substantially accords with the one described in WO97/34315 of the same applicant, which publication is declared as an integrated part of this application by reference. The system comprises a vacuum recipient 10 with several preferably round openings 12 provided along its wall. Furthermore, a set of several arc evaporation sources 14 and sputtering sources 15, preferably magnetron sources, is provided. All sources provided of the set and the openings 12 at the vacuum recipient 10 are construed identically as concerns the mount of these sources to the openings 12, such that one can freely select which sources are mounted to which openings of the recipient. Preferably, fast locks, as schematically represented at 16, are provided, e.g. bayonet locks, by which, irrespectively which, sputtering or arc evaporation sources can freely and quickly be coupled to the recipient. In the preferred configuration according to FIG. 6 at least one row of sputtering sources 15 and at least one row of arc evaporation sources 14 are provided at opposite sides of the recipient. In the recipient 10 a workpiece carrier arrangement 18 is provided, by which, as schematically represented, workpieces 20 are moved around the central axis Z of the recipient—$\omega_z$—and are therefore moved past the different sources 14, 15. The workpieces 20 are held at holder trees 22 which, as represented by $\omega_{22}$, are rotated themselves while the workpieces 20 are, if needed, rotated around their own axes, as represented by $\omega_{20}$. Into the recipients 10, controlled by a gas flow control unit 26, the gases as to be used, in particular gases containing Nitrogen and gases containing Carbon, are inlet controlled according to the instantaneous process phase. By dashed lines, the hot cathode 28 of a low-voltage discharge arrangement is shown with a gas inlet 30, preferably for Argon. The low-voltage discharge chamber 32 communicates over the schematically represented slit opening 34 with the treatment recipient. With this low-voltage discharge arrangement the workpieces 20 are etched through the opening 34 before coating. The workpieces 20 are set to a respectively desired electrical potential using an electrical generator unit as schematically represented at 36.

It is evident that according to the preferred method for deposition of the hard material layer system first only the arc evaporation sources 14 are reactively operated, preferably under inlet of reactive gases containing Nitrogen, and that for the deposition of the metallic intermediate layers the reactive gas flow is stepwise or continuously reduced with unit 26, and that further for deposition of the slide layer system the sputtering sources 15 are operated preferably with carbidic targets under the inlet of gas containing Carbon, controlled by the unit 26. The layer transitions are realised, as desired, by corresponding changes of the gas flows and/or of the evaporation and sputtering power respectively. For deposition of the slide layer system, during which the arc evaporation sources 14 are disabled, one obtains, as was already mentioned, cyclic phases during which the workpieces 20 are more exposed to the sputtering sources 15 (left position of the workpieces) and are then more distant from the sources, thereby still exposed to the influence of Carbon gas. Thereby, the preferred laminar structure is obtained for the slide layer system as was mentioned.

Results

Especially by the combined coating of sputtering and of arc evaporation, a dense, hard coating having extraordinary sliding and adhesion abilities is obtained according to the present invention.

Drilling results are shown in FIG. 7. 6 mm HSS drills have been tested using X210Cr12 material with a respective drilling depth of 15 mm. Drilling parameters have been:

Feed $v_c$=20 m/min f=0.12 mm.

Pressurised air of only 1 bar was used. It must be emphasised that the drills used were not formed for dry processing, as performed, but that the only point of this experiment was to compare the behaviour of the different coating systems. On the vertical axis of FIG. 7 the total number of holes drilled by the respective drill is represented, which number corresponds to the etch life.

It can be seen that—according to the bar A—substantially better results have been reached with the drills coated according to the invention than with the drills—according to the bar B—which have only been coated with a TiAlN hard material coating or than with drills with a hard material coating made of TiN and having a subsequent slide layer coating of Tungstencarbide and dispersed Carbon—bar C—or, referring to bar E, than with drills with a hard material coating TiN. The coating of the drills according to bar C substantially corresponds to the coating according to the U.S. Pat. No. 5,707,748.

Therefrom, it can clearly be seen that the tools i.e. the drills coated according to the invention have excellent dry processing characteristics with respect to etch life.

In FIG. 8, picture ($a_1$) and according picture ($a_2$), the courses of the drive torque for the drill spindle are shown relatively, according to ($a_1$) for a high number of subsequent drillings, according to ($a_2$) for a single drilling operation. The courses (a) have been measured for drills with a TiAlN hard material coating. The analogously represented courses ($b_1$) and ($b_2$) have been measured with drills coated according to the present invention.

It can be seen, first by comparison of the courses ($a_2$) and ($b_2$), that the necessary torque to keep a constant rotation speed, at ($a_2$) for drills with known hard material coating, substantially increases at a certain drilling depth, which leads to torque peaks according to ($a_1$), whereas no substantial increase of the drive torque necessary is observed for drills coated according to the invention, as can in particular be seen from ($b_2$), even at relatively large drilling depths. This shows the excellent sliding characteristics of the drills coated according to the invention, which proves, in combination with the results according to FIG. 7, namely the drill's etch life, that the drills coated according to the invention are particularly suitable for operation under dry processing conditions or minimum lubrication conditions, because of their excellent sliding characteristics and, simultaneously, their excellent etch life. Pressurised air was used to prevent an impairment of the drills by hardened and deformed chips. Furthermore, it has to be pointed out that both diagrams ($a_2$) and ($b_2$) have been recorded after the respective drilling of 80 holes.

Figure 9:
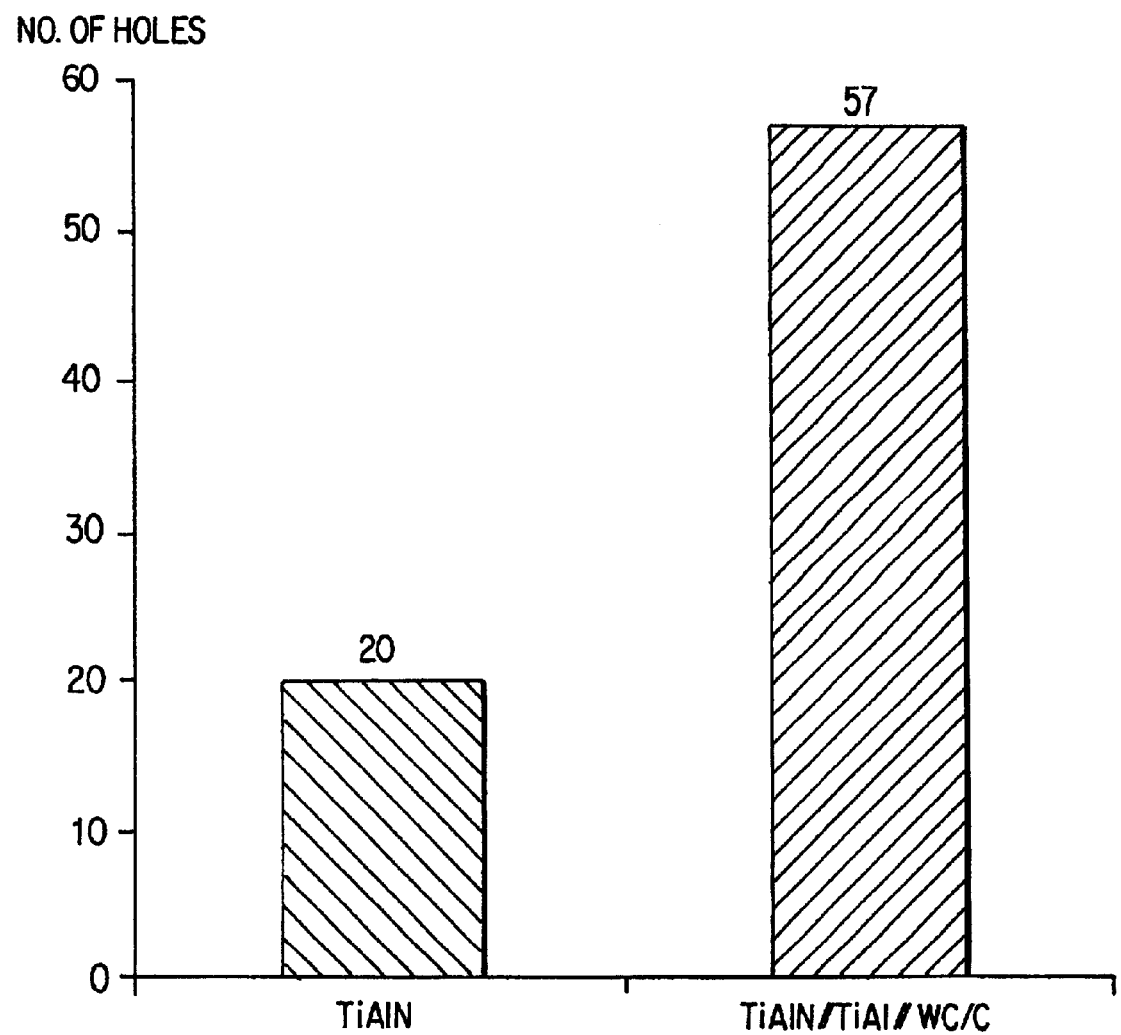
Figure 10:
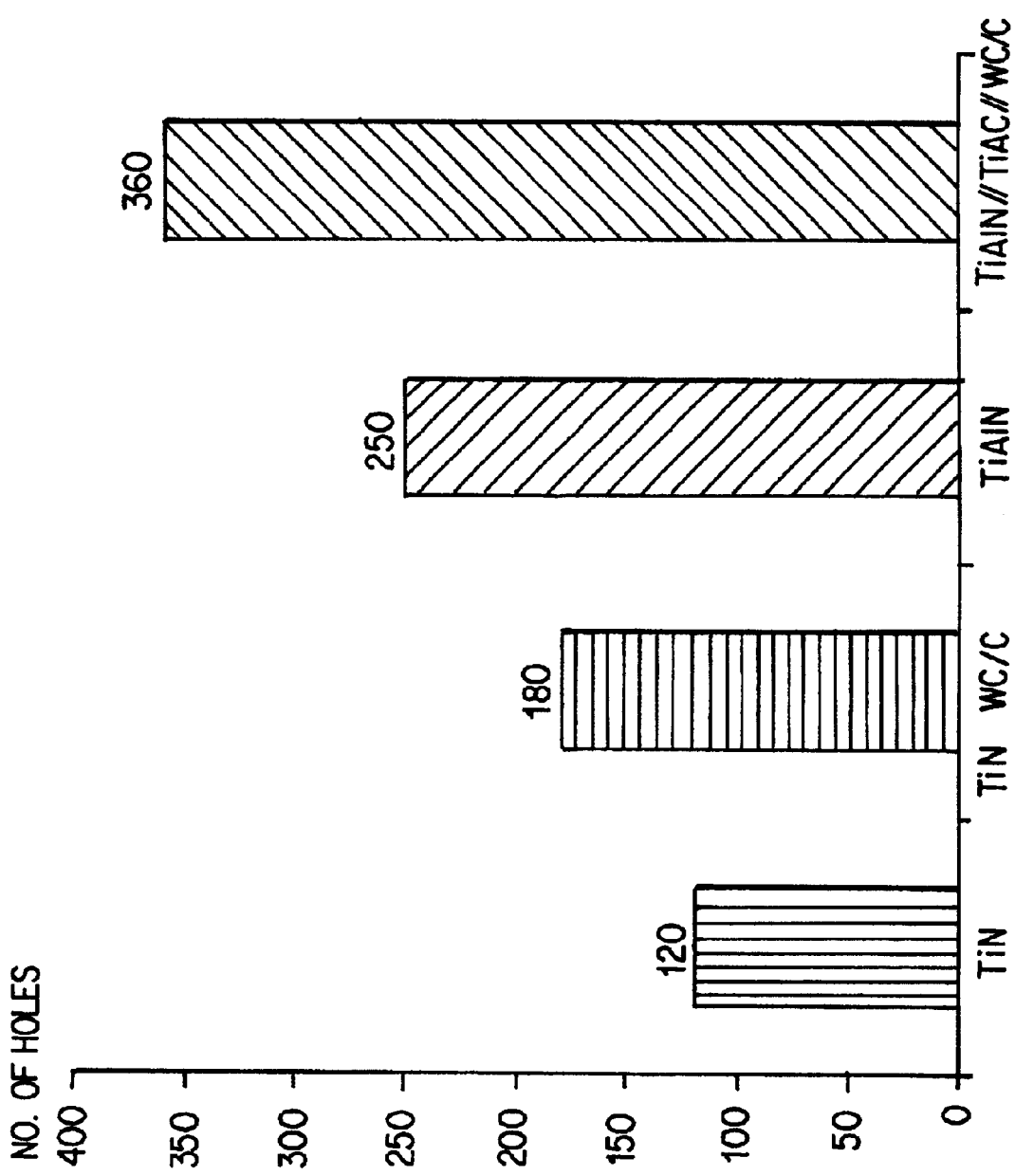

In FIG. 9 the comparative results of dry drilling are shown with inventive drills coated with the basic structure according to Nr. 2 of table I, using a slide layer of WC/C. The drill was a Solid Carbide drill with a diameter of 7.8 mm (0.307 in).

The workpiece drilled was steel AISI H11 50HRc.

The cutting parameters were:

| | |
|---|---|
| $v_c$: | 80 m/min. (262 sfm) |
| f: | 0.12 mm/rev. (0.005 ipr) | blind holes, 15 mm deep (0.6 in), dry drilling, compressed air cooling.

The columns represent the number of holes achieved.

FIG. 10 shows again the results of drilling experiments.
Tool (Inventive):
HSS drill, diameter 6 mm (0.24 inch), coated with the same basic layer system No. 2 of Table I.
Workpiece: Steel AISI D3
Cutting Parameters:

| | |
|---|---|
| $v_c$: | 20 m/min. (65 sfm) |
| f: | 0.12 mm/rev. (0.005 ipr) | blind holes of 15 mm (0.6 in) depth.
Dry Drilling, Compressed Air Cooling.

Again, the columns represent the resulting number of holes.

Figure 11:
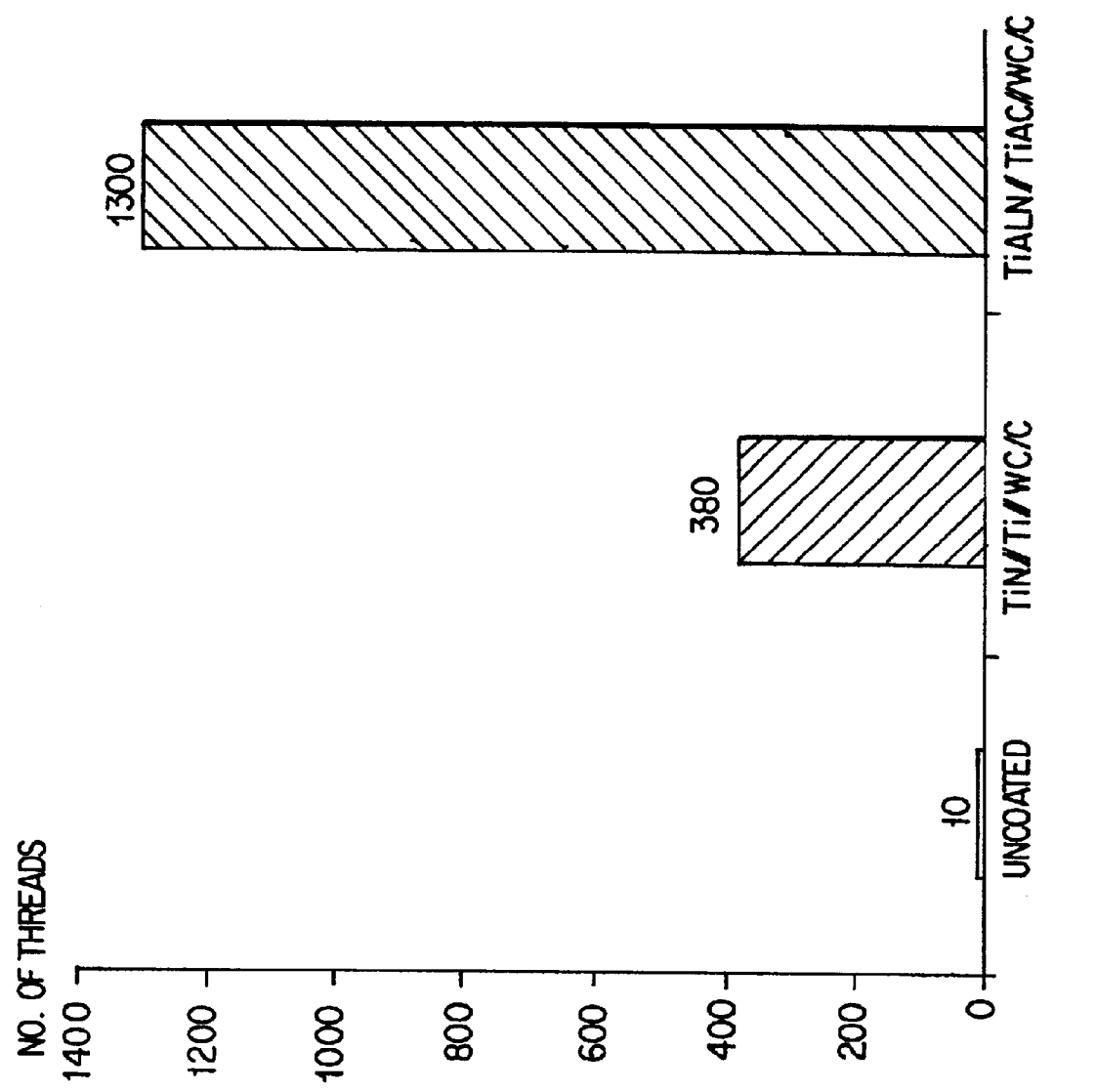

In FIG. 11 the results of dry tapping experiments with columns representing the number of threads are shown. The test conditions were:
Tool (Inventive):
HSS tap, M8, coated with a system according to table I Nr. 2
further inventively coated tool, comprising the system:
 a hard material layer of TiN
 an intermediate layer of Ti
 a slide layer of WC/C.
Workpiece: Steel AISI 4142 (DIN 42) CrMo4
Cutting Parameters:
$v_c$: 15 m/min. (49 sfm)

Figure 12:
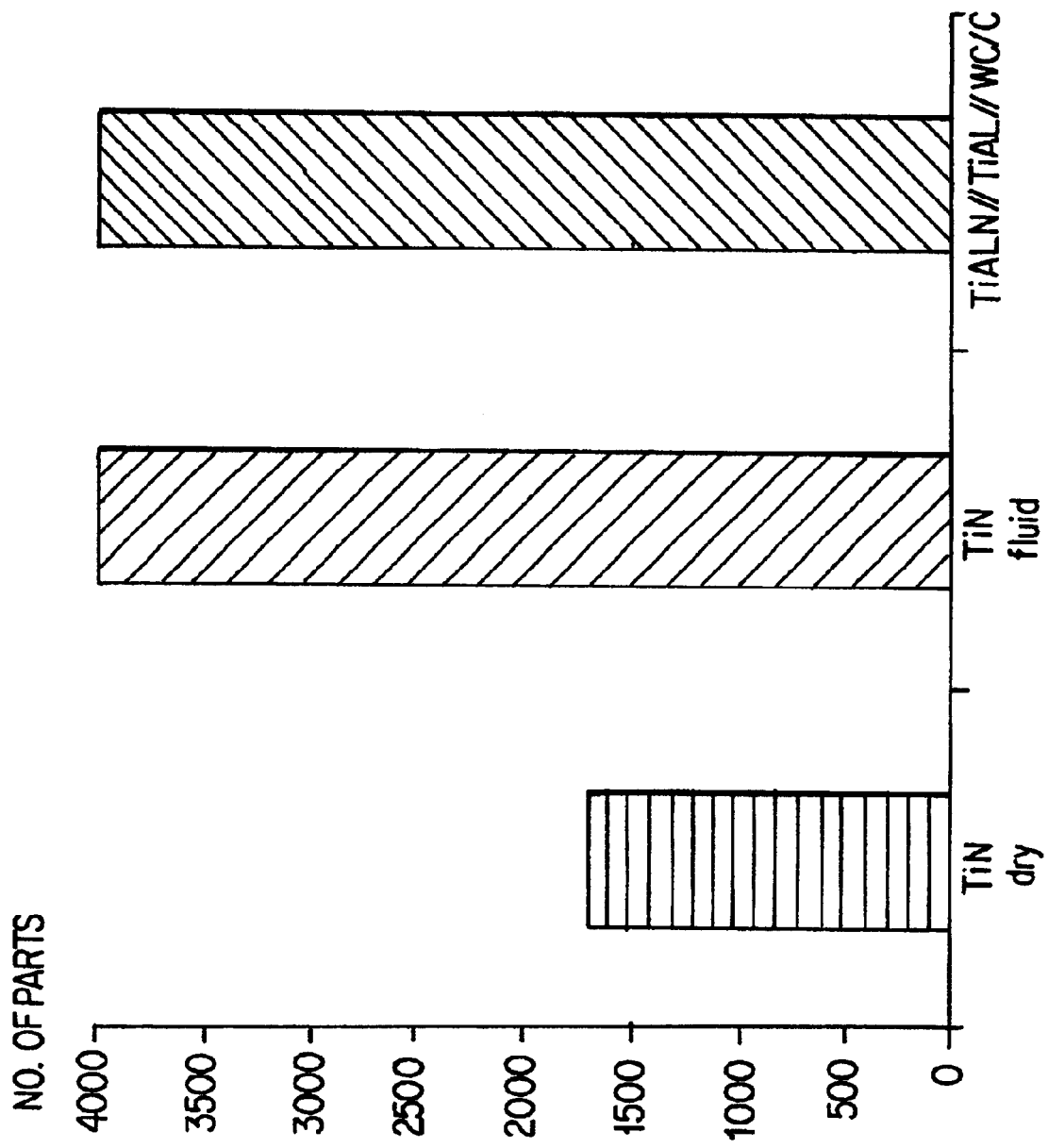

In FIG. 12 the results of dry broaching experiments are shown. Tool:
Broach, HSS (M42)
25×7×180 mm, coated with the system Nr. 2 of the above mentioned table I.
Workpiece: Hardened steel, 51 HRc
Cutting Parameters:

| | |
|---|---|
| $v_c$: | 6 m/min. (20 sfm) |
| Strobe: | 25 mm (1 in) |

Further, turning experiments with cutting plates of HSS coated with the above mentioned Nr. 2 system were performed. The workpiece was of titanium alloy, as for medical applications and turning was performed under emulsion cooling. With the cutting plates inventively coated as mentioned, the standing lifetime of the tools was three times longer than that of tools coated with just the hard material layer TiCN.

From the results it may be seen that the extremely good sliding abilities of the combined layer system according to the invention most effectively prevent cold shutting and build-up-etching, which results on one hand from the very low friction coefficient of the slide layer system 4 and thereby the extremely good start-up conditions.

On the other hand it results from the high hardness and the good supporting effect of the hard material layer system 2. Thereby, and in the start-up phase the loaded surfaces of the tool are practically "polished" by the leaving chip. The practically "polished" surfaces result in a significant lowering of the working temperature, so that e.g. during hole-drilling realised with inventive tools as according to the FIG. 7 or 8, no temper colour may be recognised, all in contrary to drilling with drills having just a TiAlN layer system. During the entire lifetime of the tool there occurs a well-controlled unobstructed chip flow, whereas the TiAlN coated drills lead to an uncontrolled, unsteady chip generation and thereby to blocking and breaking of the tool.

Thus, a coating system is proposed by the present invention, which system has besides excellent wear and tear characteristics excellent sliding characteristics and excellent adhesive power characteristics. It is in particular suitable, as mentioned, for tools and machine components, for tools in particular for cutting tools and forming tools which are operated under minimum lubrication conditions or even under dry operation conditions.

What is claimed is:

1. A method for manufacturing a tool or machine component with an increased wear resistance, comprising:
 providing a base body made of a metal or of a hard metal and having a surface;
 vacuum coating at least a portion of said surface with a hard solid layer system comprising at least one layer of a material selected from the group consisting of nitrides, carbides, oxides, carbonitrides, oxynitrides, and oxycarbonitrides of at least one metal;
 vacuum depositing upon said hard solid layer system a metallic intermediate layer comprising said at least one metal; and
 vacuum depositing on said metallic intermediate layer a sliding layer system.

2. The method of claim 1, further comprising providing said sliding layer system by at least one layer made of at least one of a carbide of at least one metal with dispersed carbon and of molybdenedisulfide and of molybdenediselenide.

3. The method of claim 1, further comprising terminating said vacuum depositing of said sliding layer system by depositing a carbon layer.

4. The method of claim 1, further comprising depositing said carbon layer as a a-c:H or a DLC layer without substantial additive of a metallic component.

5. The method of claim 1, further comprising depositing at least a part of said sliding layer system by a gas containing plasma activated carbon.

6. The method of claim 1, further comprising depositing at least a part of said sliding layer system by one of sputtering and of evaporating at least one carbon target.

7. The method of claim 6, further comprising electrically biasing said base body to one of a DC, an AC, an AC plus DC bias.

8. The method of claim 6, further comprising electrically biasing said base body by a pulsed signal.

9. The method of claim 1, further comprising depositing said at least one layer of said hard solid layer system by reactive sputtering.

10. The method of claim 1 further comprising depositing said at least one layer of said hard solid layer system by reactive magnetron sputtering.

11. The method of claim 1, further comprising depositing said at least one layer of said hard solid layer system by reactive arc evaporation.

12. The method of claim 1, further comprising selecting said at least one metal of the group consisting of at least one of titanium, chromium, hafnium, zirconium, and aluminum.

13. The method of claim 12, wherein at least two metals of said group are selected.

14. The method of claim 1, further comprising coating said at least one portion of said surface with said hard solid layer system comprising at least one of TiAl, CrAl, TiAlN, CrAlN and CrN.

15. The method of claim 14, wherein said reactive gas contains nitrogen.

16. The method of claim 14, wherein said at least one portion consists of TiAlN or CrAlN.

17. The method of claim 1, further comprising freeing said at least one metal into a vacuum atmosphere containing a reactive gas.

18. The method of claim 1, further comprising depositing at least a part of said sliding layer system in a gas containing plasma-activated carbon.

19. The method of claim 1, further comprising depositing at least a part of said sliding layer system by cathodic arc evaporation.

20. The method of claim 1, further comprising depositing at least a part of said sliding layer system by reactive sputtering.

21. The method of claim 1, further comprising depositing at least a part of said sliding layer system by reactive magnetron sputtering.

22. The method of claim 1, wherein said step of depositing said sliding layer system comprises freeing at least one of a carbide of at least one metal of the groups IVb, Vb, VIb and further of silicon and of boron, into a vacuum atmosphere of said vacuum depositing.

23. The method of claim 1, wherein said step of depositing said sliding layer system comprises freeing one of tungsten carbide, chromium carbide, titanium carbide into a vacuum atmosphere of said vacuum depositing.

24. The method of claim 1, wherein said step of depositing said sliding layer system comprises reactively depositing a carbide from a metal target.

25. The method of claim 24, further comprising performing said depositing from a titanium carbide or chromium carbide target.

26. The method of claim 25, further comprising changing a ratio between solid material freed into a vacuum atmosphere for said vacuum coating and said vacuum depositing with respect to amount of reactive gas within said vacuum atmosphere, respectively, for transiting from vacuum coating at least said portion of said surface with said at least one layer of said hard solid layer system to vacuum depositing said metallic intermediate layer.

27. The method of claim 1, wherein said step of depositing said sliding layer system comprises reactively depositing a carbide from a carbide solid material target.

28. The method of claim 1, further comprising depositing said metallic intermediate layer and said at least one layer of said hard solid layer system with the same vacuum deposition.

29. The method of claim 1, further comprising depositing a further metallic intermediate layer between said surface and said hard solid layer system.

30. The method of claim 29, further comprising depositing said further metallic intermediate layer of said at least one metal.

31. The method of claim 29, further comprising depositing said further intermediate layer with the same vacuum deposition as applied for depositing said at least one layer of said hard solid layer system.

32. The method of claim 31, where the ratio is varied between solid material freed into a vacuum atmosphere respectively for depositing said at least one layer of said hard solid layer system and for depositing said further metallic intermediate layer with respect to amount of reactive gas within said vacuum atmosphere.

33. The method of claim 1, further comprising transiting from vacuum depositing of a first layer to vacuum depositing of a subsequent layer by varying a ratio of solid material freed in a vacuum atmosphere for depositing said first layer as well as for depositing said subsequent layer with respect to amount of reactive gas in said vacuum atmosphere.

34. The method of claim 33, further comprising performing said depositing of said first layer and said depositing of said subsequent layer by one of sputtering and of arc evaporating.

35. The method of claim 34, further comprising continuously varying said ratio.

36. The method of claim 35, wherein said second layer is a layer of said sliding layer system, and said varying step comprises decreasing a ratio of freed solid material into said vacuum atmosphere to carbon gas in said atmosphere.

37. The method of claim 36, further comprising maintaining said ratio constant towards the end of depositing said sliding layer system.

38. The method of claim 1, further comprising moving said base body within a vacuum treatment chamber cyclically along at least one sputtering source and at least one arc evaporation source.

39. The method of claim 38, further comprising controlling vacuum deposition of different layers by controlling time sequences during which said body is exposed to said sputtering source and to said arc evaporation source.

40. The method of claim 38, further comprising controlling deposition of different layers by controlling at least one of the kind of reactive gas and of reactive gas flown into an area of said at least one sputtering source and of said at least one arc evaporation source.

* * * * *